United States Patent
Kim et al.

(10) Patent No.: US 8,732,922 B2
(45) Date of Patent: May 27, 2014

(54) PARYLENE-C AS A PIEZOELECTRIC MATERIAL AND METHOD TO MAKE IT

(75) Inventors: Justin Young Hyun Kim, Pasadena, CA (US); Austin Cheng, Ithaca, NY (US); Yu-Chong Tai, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 29 days.

(21) Appl. No.: 13/272,824

(22) Filed: Oct. 13, 2011

(65) Prior Publication Data

US 2012/0091858 A1  Apr. 19, 2012

Related U.S. Application Data

(60) Provisional application No. 61/392,656, filed on Oct. 13, 2010.

(51) Int. Cl.
   *H01L 41/16* (2006.01)
   *H01L 41/22* (2013.01)

(52) U.S. Cl.
   USPC ... 29/25.35; 29/846; 252/62.9 R; 252/62.9 Z; 333/193

(58) Field of Classification Search
   USPC ............ 29/25.35, 842, 846, 594; 333/193; 428/212; 252/62.9 R, 62.9 PZ
   See application file for complete search history.

(56) References Cited

U.S. PATENT DOCUMENTS

| 4,147,562 | A |   | 4/1979  | Chiang et al. |
| 4,296,391 | A | * | 10/1981 | Hazama et al. ............... 333/193 |
| 4,427,609 | A | * | 1/1984  | Broussoux et al. ....... 428/421 X |
| 4,670,074 | A | * | 6/1987  | Broussoux et al. ...... 29/25.35 X |
| 5,024,872 | A | * | 6/1991  | Wilson et al. ................. 428/421 |
| 6,747,400 | B2 |  | 6/2004  | Maichl et al. |

FOREIGN PATENT DOCUMENTS

| JP | 2002210967 A | * | 7/2002 |
| WO | 2009/141637 A1 |  | 11/2009 |

OTHER PUBLICATIONS

Jeong et al., "Fabrication of an Electromagnetic Actuator with the Planar Coil," SPIE 7th International Symposium on Smart Structures and Materials, 2000, vol. 3990, pp. 272-280.

Lo et al., "Parylene-based electret power generators," Journal of Micromech. Microengineering, 2008, vol. 18, 104006 (8pp).

International Search Report and Written Opinion, PCT application No. PCT/US2011/056220, date of mailing May 29, 2012, 7 pages.

Isarakorn et al., "Evaluation of static measurement in piezoelectric cantilever sensors using a charge integration technique for chemical and biological detection," Meas. Sci. Technol., 2010, vol. 21, pp. 1-8.

Kocharyan et al., "The Piezoelectric Effect in Polymers," Mechanics of Composite Materials, vol. 4, No. 1, pp. 117-119.

(Continued)

*Primary Examiner* — A. Dexter Tugbang
(74) *Attorney, Agent, or Firm* — Kilpatrick Townsend & Stockton LLP

(57) ABSTRACT

A parylene C polymer that is electrically poled such that it is piezoelectric is presented. Methods for manufacturing the piezoelectric parylene C polymer with an optimal piezoelectric coefficient d33 are also disclosed. Actuators formed with piezoelectric parylene C are disclosed as well as sensor devices that incorporate piezoelectric parylene C using charge integrator circuits in which the integration time is longer than likely adiabatic temperature transients.

22 Claims, 10 Drawing Sheets

(56) References Cited

OTHER PUBLICATIONS

Kramer et al., "Polymerization of Para-Xylylene Derivatives (Parylene Polymerization). I. Deposition Kinetics for Parylene N and Parylene C," Journal of Polymer Science: Polymer Chemistry Edition, 1984, vol. 22, pp. 475-491.

SCS Parylene Properties, Specialty Coating Systems (SCS), World Headquarters, Indianapolis, IN, pp. 1-12.

Senkevich et al., "Morphology of poly(chloro-p-xylylene) CVD thin films," Polymer 40, 1999, pp. 5751-5759.

Senkevich et al., "Thermomechanical Properties of Parylene X, A Room-Temperature Chemical Vapor Depositable Crosslinkable Polymer," Chemical Vapor Deposition, 2007, vol. 13, pp. 55-59.

Spivack, "Mechanical Properties of Very Thin Polymer Films," Rev. Sci., Instru., 1972, vol. 43, No. 7, pp. 985-990.

Xu et al., "Longitudinal piezoelectric coefficient measurement for bulk ceramics and thin films using pneumatic pressure rig," Journal of Applied Physics, vol. 86, No. 1, pp. 588-594.

\* cited by examiner

PARYLENE N

PARYLENE C

PARYLENE D

PARYLENE AF-4

POLYVINYLIDENE FLUORIDE (PVDF)

POLYMERIZED PARYLENE C

ELECTRICALLY POLED, PIEZOELECTRIC PARYLENE C

ELECTRICALLY POLED, PIEZOELECTRIC PARYLENE C

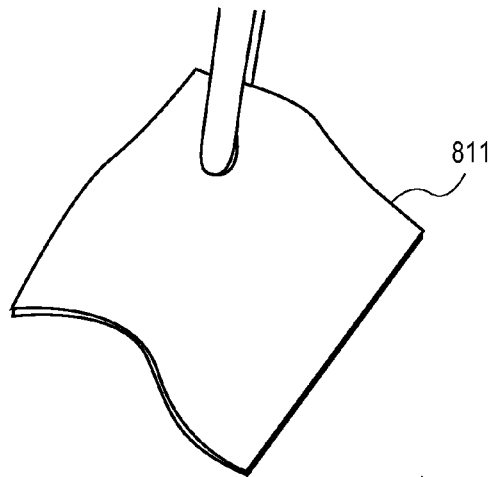
FIG. 8
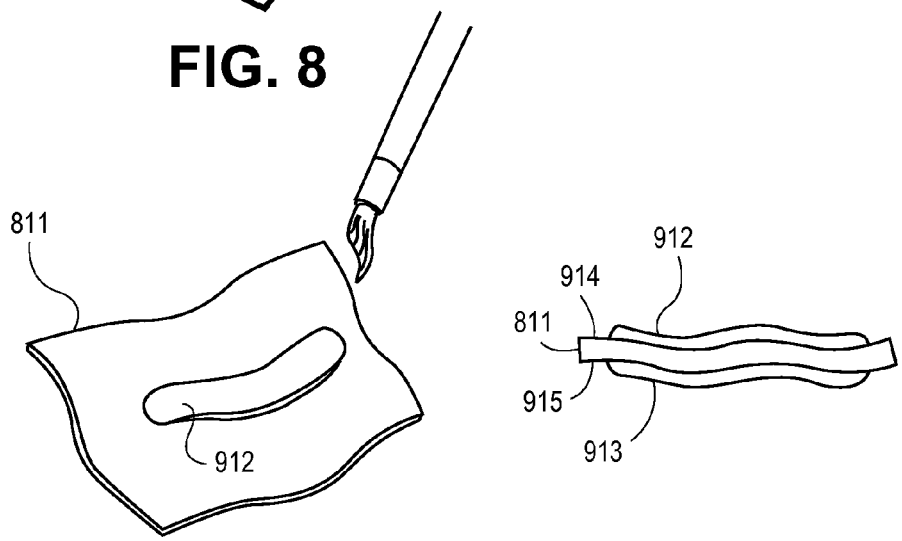
FIG. 9A  FIG. 9B
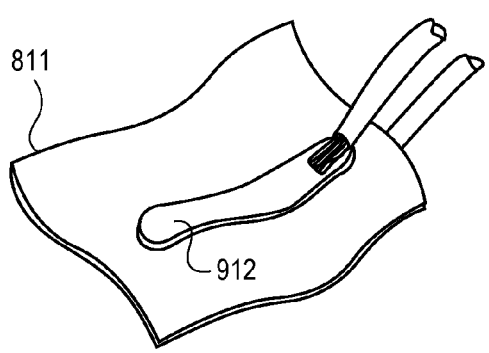 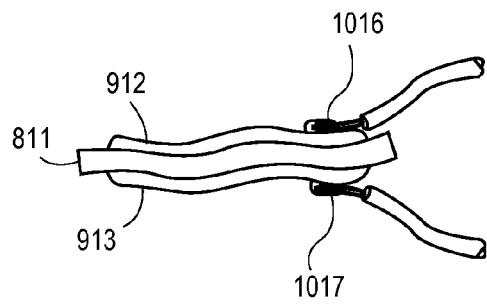
FIG. 10A  FIG. 10B

PARYLENE-C AS A PIEZOELECTRIC MATERIAL AND METHOD TO MAKE IT

CROSS-REFERENCES TO RELATED APPLICATIONS

This application claims the benefit of U.S. Provisional Application No. 61/392,656, filed Oct. 13, 2010, which is hereby incorporated by reference in its entirety for all purposes.

STATEMENT AS TO RIGHTS TO INVENTIONS MADE UNDER FEDERALLY SPONSORED RESEARCH OR DEVELOPMENT

NOT APPLICABLE

BACKGROUND

Parylene is a generic name for members of a series of poly(p-xylylene) polymers. Parylene polymer is known to excel as a dielectric and as a water vapor barrier without being toxic. Having been commercialized in the 1960s, parylene has found widespread use in the electronics, automotive, aerospace, medical, and other industries. It generally has preferable chemical vapor depositing attributes compared to other conformal coating materials such as acrylics, epoxies, polyurethanes, and silicons. For example, some parylenes can be deposited in extremely thin layers that are relatively strong and essentially pinhole-free. It is precisely these depositing characteristics that make parylene useful in micro/nanofabrication.

FIGS. 1-4 are molecular structure diagrams of four types of parylene of the prior art.

FIG. 1 shows parylene N, the basic member of the series. It is commonly derived from [2.2]paracyclophane, which can be synthesized from p-xylene. Parylene N is typically a completely linear, highly crystalline material.

FIG. 2 shows parylene C, which has one chlorine group per repeat unit. It is typically produced from the same dimer as parylene N but having a chlorine atom substituted for one of the aromatic hydrogen atoms.

FIG. 3 shows parylene D, which has two chlorine groups per repeat unit. Although it has better diffusion characteristics than parylene C, parylene D generally deposits less uniformly than parylene C.

FIG. 4 shows parylene AF-4, with the alpha hydrogen atoms of the N dimer replaced with fluorine. Parylene AF-4 is also known as Parylene SF as manufactured by Kisco Conformal Coating, LLC of California (a subsidiary of Kisco Ltd. of Japan), and PARYLENE HT® as manufactured by Specialty Coating Systems, Inc. of Indianapolis, Ind.

Other parylenes, such as parylene VT-4, parylene A, parylene AM, and parylene X, are known in the art and are used for specialized products in industry.

Fundamental aspects of parylene N and parylene C are detailed in P. Kramer et al., "Polymerization of Para-Xylylene Derivatives (Parylene Polymerization). I. Deposition Kinetics for Parylene N and Parylene C," *Journal of Polymer Science: Polymer Chemistry Edition*, Vol. 22 (1984), pp. 475-491. This journal article is hereby incorporated by reference in its entirety for all purposes.

Fundamental aspects of parylene X are detailed in J. Senkevich et al., "Thermomechanical Properties of Parylene X, A Room-Temperature Chemical Vapor Depositable Crosslinkable Polymer," *Chem. Vap. Deposition,* 2007, 13, pp. 55-59. This journal article is hereby incorporated by reference in its entirety for all purposes.

Parylene C

Of the common types of parylene, parylene C is perhaps the most widely used in industry. Its ease of use and especially well-mannered chemical vapor deposition characteristics make it ideal for use as a conformal coating on printed circuit boards and as a structure or sacrificial intermediate in nanofabricated devices. Its demonstrated bio-compatibility as a United States Pharmacopeial Convention (USP) Class VI biocompatible polymer makes it suitable for medical devices.

Parylene C is sometimes referred to with a dash, i.e., "parylene-C," and sometimes is abbreviated as "PA-C."

Parylene C membrane substrates generally have strength and flexibility (e.g., Young's modulus≈4 GPa), conformal pinhole-free room-temperature deposition, a low dielectric constant (≈3), high volume resistivity ($>10^{16}$ Ω-cm), transparency, and ease of manipulation using standard microfabrication techniques such as reactive ion etching (RIE).

A need exists in the art for better materials or more uses for old materials.

BRIEF SUMMARY

Generally, parylene C has been produced that is piezoelectric. Methods to manufacture piezoelectric parylene C using optimal poling techniques are described herein. Also disclosed are piezoelectric devices using piezoelectric parylene C.

Stock, non-piezoelectric parylene C film can be heated to a temperature of about 100° C. to 350° C. while applying an electric field between 5 MV/m and 40 MV/m. While the electric field is still applied, it is then quenched so that it is electrically poled. If manufactured correctly, the resulting electrically poled parylene C is piezoelectric and can be used in sensor and/or actuator devices.

An embodiment of the present invention relates to a composition of matter, including an electrically-poled, piezoelectric parylene-C polymer.

The composition can include a polymer in which a longitudinal piezoelectric coefficient d33 is between about −0.01 pC/N and −2.00 pC/N. It can be manufactured by heating a parylene-C polymer portion to a temperature of about 100° C. to 350° C. while applying an electric field between about 5 MV/m to 100 MV/m to the portion, and then cooling (e.g., quenching) the portion while the electric field is applied.

Another embodiment includes a process of manufacturing a piezoelectric parylene-C polymer. The method includes heating a parylene-C polymer while applying an electric field to the polymer, and then cooling the polymer while the electric field is applied.

The heating can be to a temperature between about 100° C. and 350° C., 100° C. and 150° C., or 250° C. and 350° C. in a low oxygen or vacuum environment. The heating can be performed using a hot plate in contact with the polymer, an oven, an infrared lamp, or blowing hot gas.

Applying the electric field can include applying an electric field through the polymer between 5 MV/m and 100 MV/m or between 5 MV/m and 40 MV/m. The heating and applying of the electric field can occur without stretching the parylene C as is done with PVDF. The cooling, which can include quenching, can include using a cold (less than 50° C.) plate. Cooling can be done by contact with cold gas, liquid, solids, powder, etc.

The polymer can be configured as a film less-than-or-equal-to 100 μm thick. Electrodes can be formed on the polymer at a predetermined distance from one another. Voltage/charge or current can be measured or applied between the electrodes.

Another embodiment includes a device for transducing mechanical stress to electric charge or vice versa, the device including a parylene-C polymer, the polymer being electrically poled, and at least two electrodes conductively connected with the polymer.

An insulating material can be intimately attached with a face of a polymer in film form. The electrodes can be formed as intermeshing comb electrodes. A distance between two of the comb electrodes can be between 0.5 µm to 100 µm, a width of the comb electrodes can be between 0.5 µm to 100 µm, a length of the comb electrodes can be between 1 µm to 2 mm, and a thickness of the electrodes can be between 100 nm to 2 mm. The electrodes can be disposed on one face of the polymer, opposing faces of the polymer, and/or disposed within the polymer. The electrode material can be independently selected from the group consisting of metal, conducting polymer, conducting inorganic material, and conducting ink.

The device can be a sensor device that includes a charge integrator circuit. It can include a high-impedance input amplifier having more than 10 kΩ of input impedance operatively connected with the electrodes. The device can be an actuator device configured to apply a mechanical force.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

FIG. 8 illustrates a peeled-and-cut film of parylene C in accordance with an embodiment.

FIGS. 9A-9B illustrate electrodes painted on the parylene C film of FIG. 8 in accordance with an embodiment. FIG. 9A is an oblique view, and FIG. 9B is an elevation view.

FIGS. 10A-10B illustrate wires attached to the electrodes of the parylene C film of FIGS. 9A-9B in accordance with an embodiment. FIG. 10A is an oblique view, and FIG. 10B is an elevation view.

DETAILED DESCRIPTION

In general, piezoelectric parylene C is presented. Methods for manufacturing it using poling techniques as well as devices that incorporate it are also described. Piezoelectric parylene C has apparently not been reported before.

A portion of standard, stock parylene C film that has not been electrically poled can be electrically poled by heating it to a temperature of about 100° C. to 350° C. while applying an electric field between 5 MV/m and 40 MV/m, then quenching it to room temperature. Other methods of manufacture are described.

A parylene C film with a thickness of less-than-or-equal-to (≤)100 µm has been found to be effective. Such thicknesses can easily be achieved using chemical vapor deposition techniques.

Parylene was first produced in a laboratory in the 1940s and was commercialized in the 1960s. Despite the many studies of parylene polymers—and heavy reliance by industry in many types of high-end manufacturing—there has been no report before of any parylene polymer exhibiting piezoelectric behavior. That is, parylenes N, C, D, AF-4, VT-4, A, AM, X, and others have never been found to be piezoelectric.

The inventors, one of whom has been a professor at the California Institute of Technology (Caltech), Pasadena, Calif. (i.e., the Assignee) since 1989 and has studied parylenes extensively, have not encountered actual piezoelectric properties in parylenes before piezoelectric parylene C was manufactured and proven as piezoelectric in their laboratory.

Figure 1:
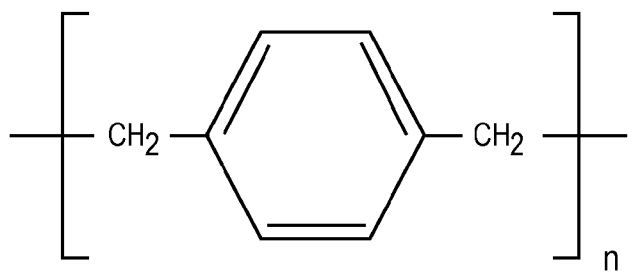
FIG. 1 is a molecular structure diagram of parylene N as known in the prior art.
Figure 2:
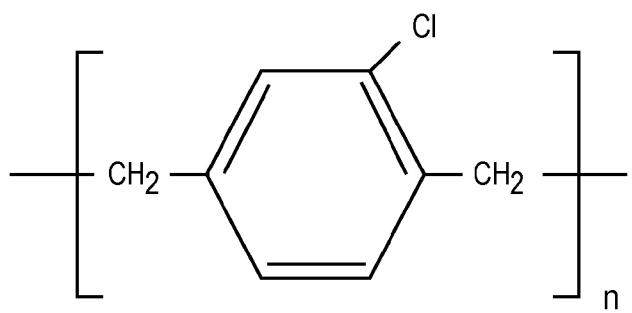
FIG. 2 is a molecular structure diagram of parylene C as known in the prior art.
Figure 3:
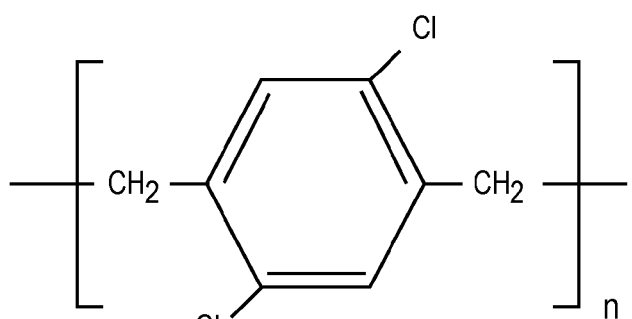
FIG. 3 is a molecular structure diagram of parylene D as known in the prior art.
Figure 4:
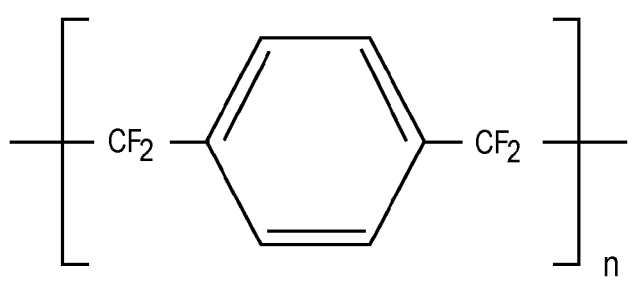
FIG. 4 is a molecular structure diagram of parylene AF-4 as known in the prior art.
Figure 5:
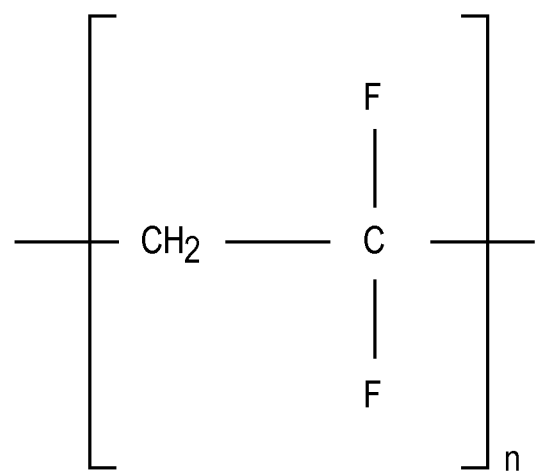
FIG. 5 is a molecular structure diagram of polyvinylidene fluoride (PVDF) as known in the prior art.

FIG. 5 is a molecular structure diagram of polyvinylidene fluoride (PVDF) fluoropolymer, otherwise known as poly-1,1-difluoroethene. PVDF fluoropolymer has been known in the prior art to exhibit piezoelectric properties when stretched and poled under tension. PVDF is not a parylene. PVDF and parylene are quite different polymers in many respects. Unlike parylene, PVDF lacks benzene rings and is symmetric about its monomer's longitudinal axis.

Figure 6:
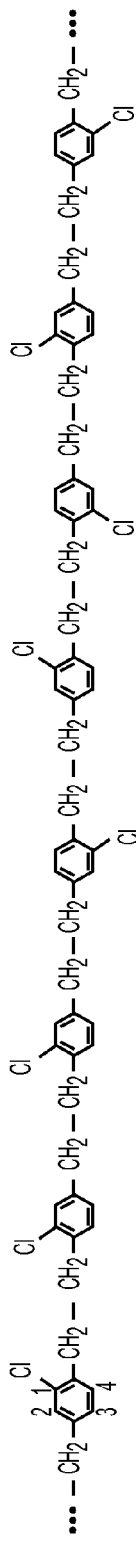
FIG. 6 is an expanded molecular structure diagram of parylene C as known in the prior art.

FIG. 6 is an expanded molecular structure diagram of parylene C as known in the prior art. In the prior art, parylene C's chlorine groups are randomly oriented. That is, when parylene C undergoes polymerization, parylene C's monomers join together such that their chlorine atoms are directed randomly and independently from their adjacent monomers. As shown in the diagram, the chlorine atoms are positioned randomly in one of four free positions around the benzene ring.

Figure 7A:
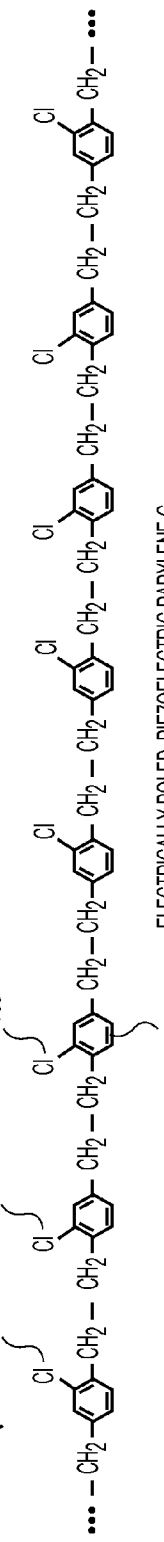
FIG. 7A is an expanded molecular structure diagram of electrically poled, piezoelectric parylene C in accordance with an embodiment.

FIG. 7A is an expanded molecular structure diagram of electrically-poled, piezoelectric parylene C in accordance with an embodiment. As theorized, the large benzene groups with outcropping chlorine atoms are locked in place at room temperatures and below.

When heat is applied, they become able to swing around their longitudinal axes, which are relatively fixed by the polymer bonds. When an electric field is applied, many—if not most—of the chlorine atoms swing free to align along the same side of the polymer chain, aligning themselves with the electric field. Upon cooling, the chains nestle back into their frozen state with the chlorine atoms still aligned on one side of the chain. The resulting polarization causes the parylene C to be piezoelectric.

The piezoelectric parylene C in FIG. 7A can be manufactured from the nonpiezoelectric parylene C in FIG. 6. As stated above, it is believed that heating and applying an electric field to the parylene C of FIG. 6 causes the benzene groups to rotate about their $CH_2$ bonds so that their chlorine atoms end up on one side of the polymer chain. For example, chlorine atoms 701 and 702 remain in place at the top, but benzene ring 704 rotates so that chlorine atom 703 moves from the bottom to the top and is aligned on the same side of the chain as chlorine atoms 701 and 702.

Parylene C is 'asymmetric' in that it possesses a single chlorine atom that hangs off its benzene group; therefore, it has a net dipole moment to its monomer. This is in contrast to parylene N, parylene D, and parylene AT-4, which are symmetric. It is theorized that aligning the dipole moments of a majority of monomers results in the observed piezoelectric effect. It is also theorized that this is why no piezoelectric properties have been observed in the other, symmetric parylenes.

In U.S. Pat. No. 4,147,562, issued Apr. 3, 1979, parylene C was reported as a 'pyroelectric' sensor material—a material that produces voltage as a result of a change in temperature. However, the reference does not disclose, teach, or suggest piezoelectric effects from parylene C.

A "piezoelectric" material includes a material that produces electricity or electric polarity when subjected to pressure or mechanical stress. Conversely, it can produce movement, pressure, or mechanical stress when subjected to electricity or electric polarity. A piezoelectric material can exhibit other piezoelectric properties as known in the art. Piezoelectricity, or a material's longitudinal piezoelectric coefficient d33, is often measured in pico columbs per newton (pC/N)

A "low oxygen environment" includes an environment where oxygen in the air has been displaced by other gases, such as dry nitrogen, or vacuum environments.

"About" in reference to a temperature or other engineering units includes measurements or settings that are within $\pm 1\%$, $\pm 2\%$, $\pm 5\%$, $\pm 10\%$, or other tolerances of the specified engineering units as known in the art.

An "intimately attached" layer includes a layer spread across a film or as otherwise known in the art.

Electric fields are often measured in megavolts per meter (MV/m).

Figure 7B:
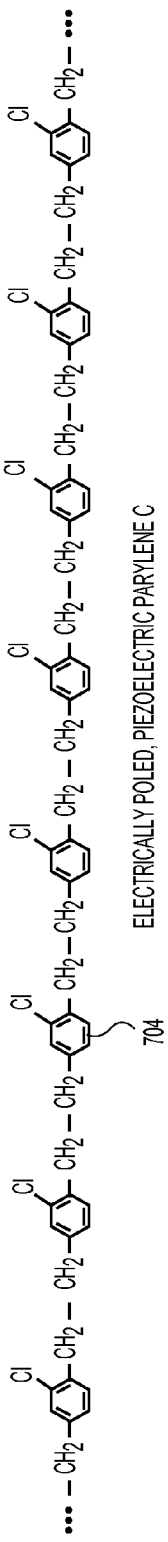
FIG. 7B is an expanded molecular structure diagram of electrically poled, piezoelectric parylene C in accordance with an embodiment.

FIG. 7B is an expanded molecular structure diagram of electrically poled, piezoelectric parylene C in accordance with an embodiment. Not only are the chlorine atoms all on the same side of the polymer, i.e., the top, but all the chlorine atoms are in the same position on their respective benzene rings. This is sometimes referred to as a head-tail configuration of the monomers. This configuration may be difficult to achieve from the unpoled parylene C of FIG. 6.

Figure 7C:
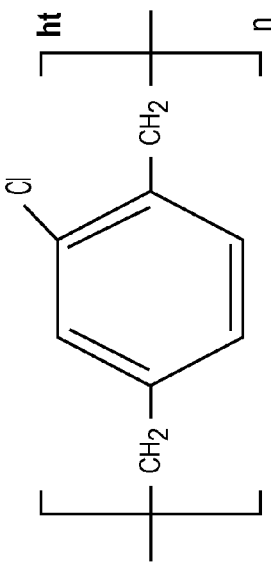
FIG. 7C is a molecular structure diagram of parylene C designating a head-tail configuration as in FIG. 7B.

FIG. 7C is a molecular structure diagram of parylene C designating a head-tail configuration, i.e., "ht." The molecular structure diagram of FIG. 7C is essentially a shorthand for the expanded molecular structure diagram of FIG. 7B.

FIGS. 8-10B illustrate the preparation of a parylene C film for electrical poling to impart piezoelectric properties to it.

FIG. 8 illustrates a peeled and cut film of parylene C film in accordance with an embodiment. Parylene C film 811 has been chemical vapor deposited on a surface as a film, peeled from the surface, and cut into a rectangular shape.

FIGS. 9A-9B illustrate electrodes painted on the parylene C film of FIG. 8 in accordance with an embodiment. Conductive silver ink is painted onto both top 914 and bottom 915 of parylene C film 811 to form top electrode 912 and bottom electrode 913.

In alternate embodiments, the electrodes are other metals, conducting polymer, conducting inorganic material, or conducting ink. Both electrodes can be the same material or be composed of different materials.

FIGS. 10A-10B illustrate wires attached to the electrodes of the parylene C film of FIGS. 9A-9B in accordance with an embodiment. Wire 1016 is soldered to top electrode 912, and wire 1017 is soldered to bottom electrode 913. Both wires have a fluorinated ethylene propylene (FEP) jacket. The wire leads can be connected to a high voltage source for further processing.

Figure 11:
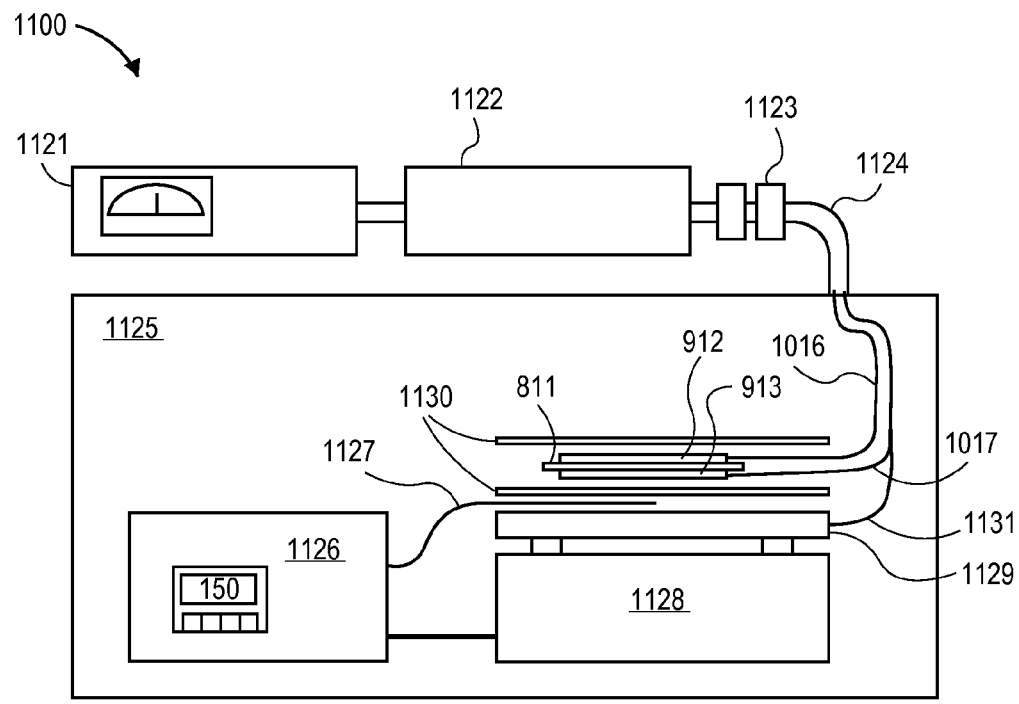
FIG. 11 illustrates a manufacturing apparatus in accordance with an embodiment.

FIG. 11 illustrates a manufacturing apparatus in accordance with an embodiment. Apparatus 1100 includes high voltage source 1121, which provides a voltage of up to 5 kV. High voltage source 1121 is connected with a 10 MΩ, 3 W resistor and inductor box 1122. Resistor and inductor box 1122 is connected through ferrite choke 1123 by way of high voltage coaxial cable 1124 into glove box 1125. Inside glove box 1125, which is filled with dry nitrogen, conductors of high voltage coaxial cable 1124 are attached to wires 1016 and 1017, which are in turn connected to top electrode 912 and bottom electrode 913, respectively, of parylene C film 811.

Parylene C film 811 directly rests on and is covered by mica insulating sheets 1130. Parylene C film 811 and bottom mica insulating sheet 1130 rest on working surface 1129 of hot plate 1128. Hot plate 1128, or rather its working surface 1129, is adjustable from room temperature (i.e., about 25° C.) to about 200° C. Hot plate 1128 is controlled by hot plate controller 1126, which is set with a feedback loop to control hot plate 1128 by sensing a temperature through thermocouple 1127. Thermocouple 1127 rests between working surface 1129 of hot plate 1128 and the bottom mica insulation sheet. Thus, the temperature is read between the mica insulating film and the hot plate. Because the parylene C is also covered with a top mica insulating sheet, and its prone, film form is intimately exposed to heating and cooling effects, its temperature can be assumed to be close to the reading of the thermocouple.

In alternate embodiments, an oven, an infrared lamp, or blowing hot air can heat the parylene C polymer. In other embodiments, hot liquid can be applied, such as silicone oil or mineral oil. The work piece can be immersed in the hot liquid.

Temperatures of "about" a certain temperature can be understood to account for a thermocouple or other measurement device being displaced from the material itself, such as that shown in the figure.

Working surface 1129 is connected by wire 1131 to ground through high voltage cable 1124. Wire 1017 is also connected to ground through the high voltage cable, while wire 1016 is connected to the high side of the high voltage source.

Figure 12:
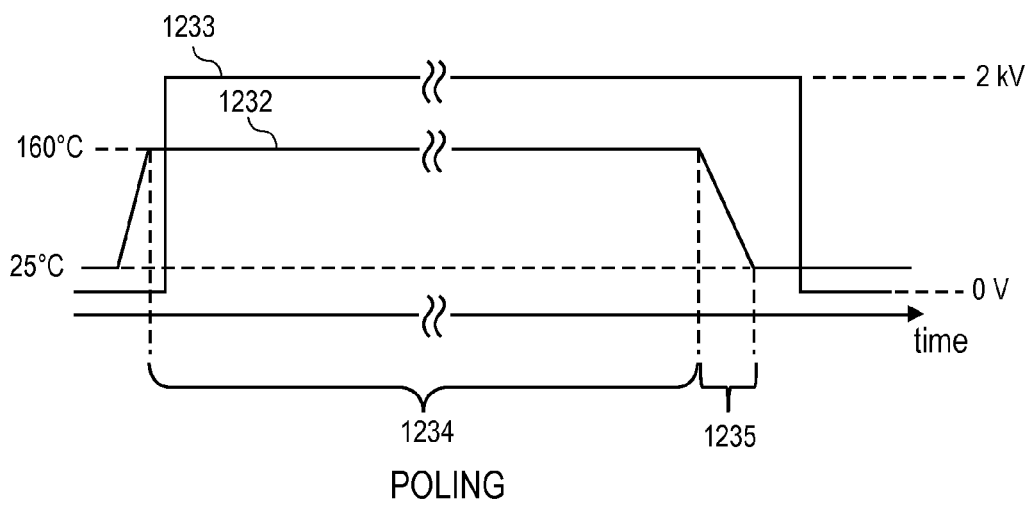
FIG. 12 is a poling timing diagram in accordance with an embodiment.

FIG. 12 is a poling timing diagram in accordance with an embodiment. The timing diagram can be used with the manufacturing apparatus of FIG. 11. Temperature 1232 of a parylene C polymer can be raised from room temperature to about 160° C. Voltage 1233 is applied, either before or after (as shown) the temperature is raised, from 0 to 2 kV. Applying the voltage applies an electric field across a thin film of parylene C such as film 811 in FIG. 11.

Both temperature 1232 and voltage 1233 are kept high for time 1234. It has been shown during experiments that piezoelectric coefficient d33 is independent of the poling time from 30 minutes to 12 hours.

During time 1235, temperature 1232 is rapidly reduced by quenching the parylene C film for 1 minute while voltage 1233 is kept high. Quenching can be accomplished by removing the top heat insulation mica film and moving the film and bottom mica sheet to a 6×6×0.125 inch stainless steel metal plate at room temperature. The cooling plate can be grounded. After temperature 1232 has come down, electric voltage 1233 is shut off. If the process is done correctly, the resulting parylene C film can exhibit piezoelectric properties.

Figure 13:
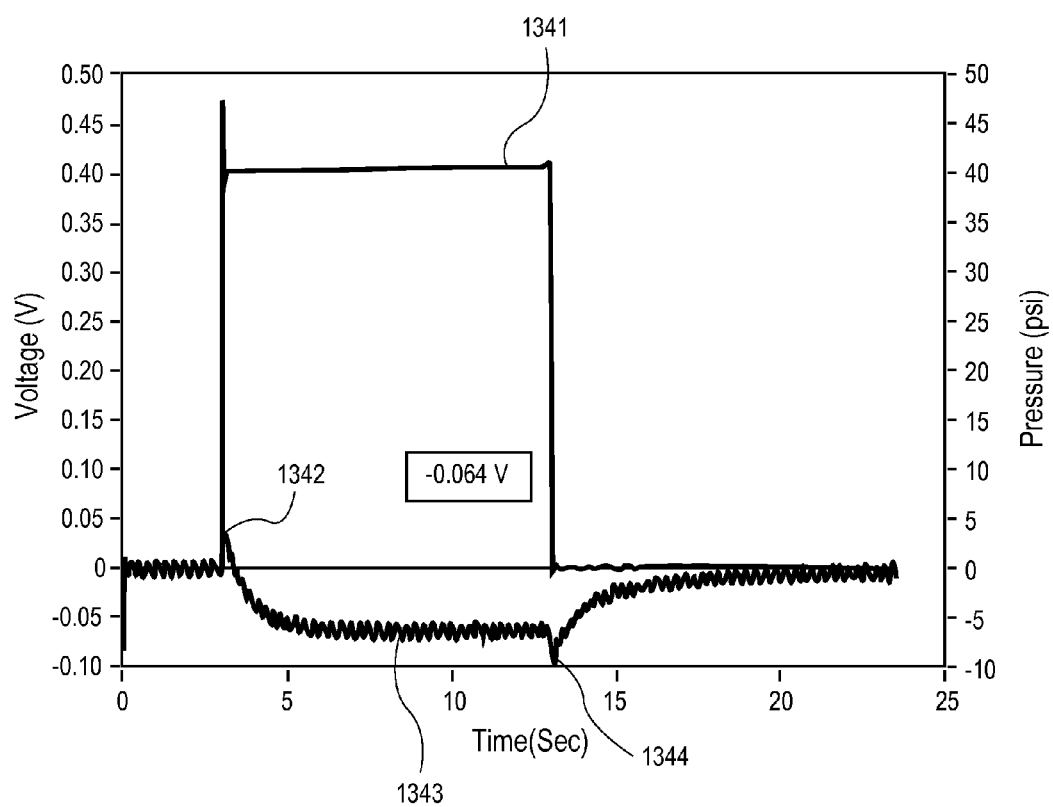
FIG. 13 is a plot of an empirical test of piezoelectric parylene C in accordance with an embodiment.

FIG. 13 is a graph of an empirical test of piezoelectric parylene C in accordance with an embodiment.

The piezoelectric coefficient of a film can be measured by monitoring the net charge change when a mechanical stress is applied on the film. To essentially guarantee an evenly distributed mechanical stress, a parylene C device manufactured from apparatus 1100 was mounted on an aluminum chamber wall, and a step-wise pneumatic pressure was applied by pressurized nitrogen gas.

The pneumatic system included a regulator, gas reservoir, solenoid valve, and gas chamber. The gas reservoir served to reduce pressure fluctuation when the solenoid valve was opened or closed. To minimize the filling and venting time, the solenoid valve was attached right above the lid of the chamber. The chamber is made from aluminum and sized to 2 cubic centimeters.

An electrode, which was connected to the ground during the poling, is connected to the ground of a charge integrator. The charge integrator included an IVC102 trans-impedance amplifier, manufactured by Burr-Brown Corp. of Tucson, Ariz., which has a 100 pC capacitor and a reset switch for discharging after each measurement. The charge output from the parylene C piezoelectric film is connected to the capacitor. The charge integrator's output is further connected to an inverter to recover an original polarity.

Pressure 1341 is applied to the chamber, compressing the piezoelectric parylene C. A transient positive voltage is produced in peak 1342, which then settles down to steady state 1343. The resulting voltage is −0.64 V. When pressure 1341 is released, a transient further-negative voltage is produced in peak 1344, then the voltage settles back to zero volts.

Figure 14:
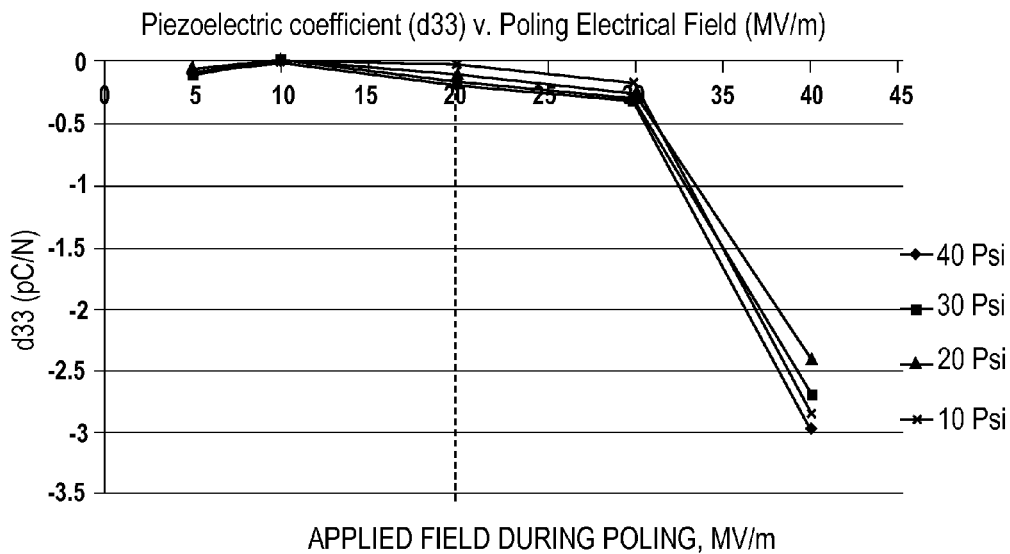
FIG. 14 is a plot of measured piezoelectric coefficients versus applied electrical fields from several empirical tests of piezoelectric parylene C samples in accordance with an embodiment.

FIG. 14 is a plot of measured piezoelectric coefficients (d33's) versus applied electrical fields during poling from several empirical tests of polymers in accordance with an embodiment. The samples tested for this data were manufactured by poling at 200° C. for 2 hours at the specified electric field, then quenched. The four lines are the measured piezoelectric coefficients at different test pressure step levels. For example, the 40 psi data points were measured using 40 psi step pressures as shown in FIG. 13.

The negative d33 values indicate that the material compresses instead of expanding when exposed to the same polarity of the electric field with which it was poled.

Parylene C can be made piezoelectric by poling with an electric field of 5 MV/m, as shown in the plot. However, as apparent by the local maximum at 10 MV/m, the piezoelectricity disappears when using an electric field of around 10 MV/m. At electric fields greater than 10 MV/m, the imparted piezoelectricity increases when using a higher electric field. A significant increase in piezoelectricity occurs above 30 MV/m. Because of an electrical break down, the electric field was not tested in this case above 40 MV/m.

Figure 15:
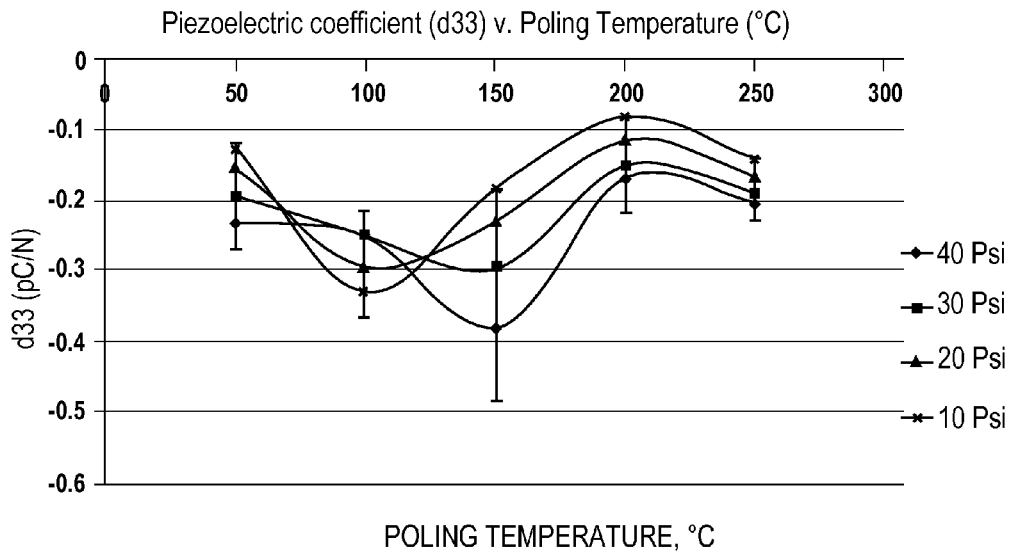
FIG. 15 is a plot of measured piezoelectric coefficients versus poling temperatures from several empirical tests of piezoelectric parylene C samples in accordance with an embodiment.

FIG. 15 is a plot of measured piezoelectric coefficients (d33's) versus applied temperatures during poling from several empirical tests of polymers in accordance with an embodiment. The samples tested for this data were manufactured by poling at 20 MV/m for 2 hours at the specified temperature, then quenched. The four curve-fit lines are the measured piezoelectric coefficients at different test pressure step levels.

Parylene C can be made piezoelectric by poling at 50° C. (122° F.). As apparent in the local minimums in the plot, the piezoelectric coefficient peaks between 100° C. and 150° C.

Temperatures above 250° C. can scorch parylene C; however, such scorching can be minimized by heating the polymer in a low oxygen environment, such as a dry nitrogen-filled glove box.

Figure 16:
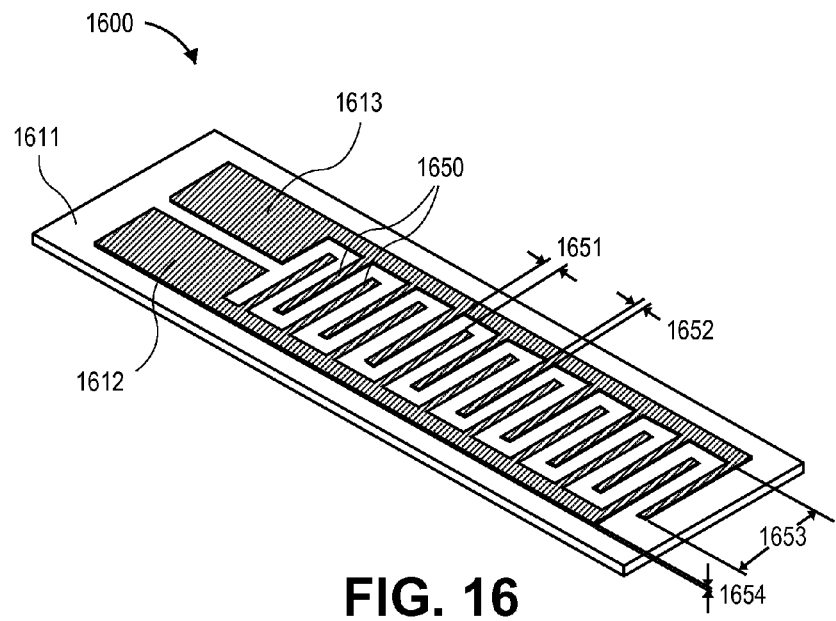
FIG. 16 is an oblique view of a surface-mounted comb electrode device in accordance with an embodiment.

FIG. 16 is an oblique view of a surface-mounted comb electrode device in accordance with an embodiment. Device 1600 has a substrate of piezoelectric parylene C polymer 1611. Left comb electrode 1612 and right comb electrode 1613 are essentially offset mirror images of one another.

Both comb electrodes 1612 and 1613 have comb teeth 1650 that interlace with those of the other comb electrode. Distance 1651 between the comb electrodes is between 0.5 μm to 100 μm. Width 1652 of the comb electrodes is between 0.5 μm to 100 μm. Length 1653 of the comb electrodes is between 1 μm to 2 mm. Thickness 1654 of the comb electrodes is between 100 nm to 2 mm.

Figure 17:
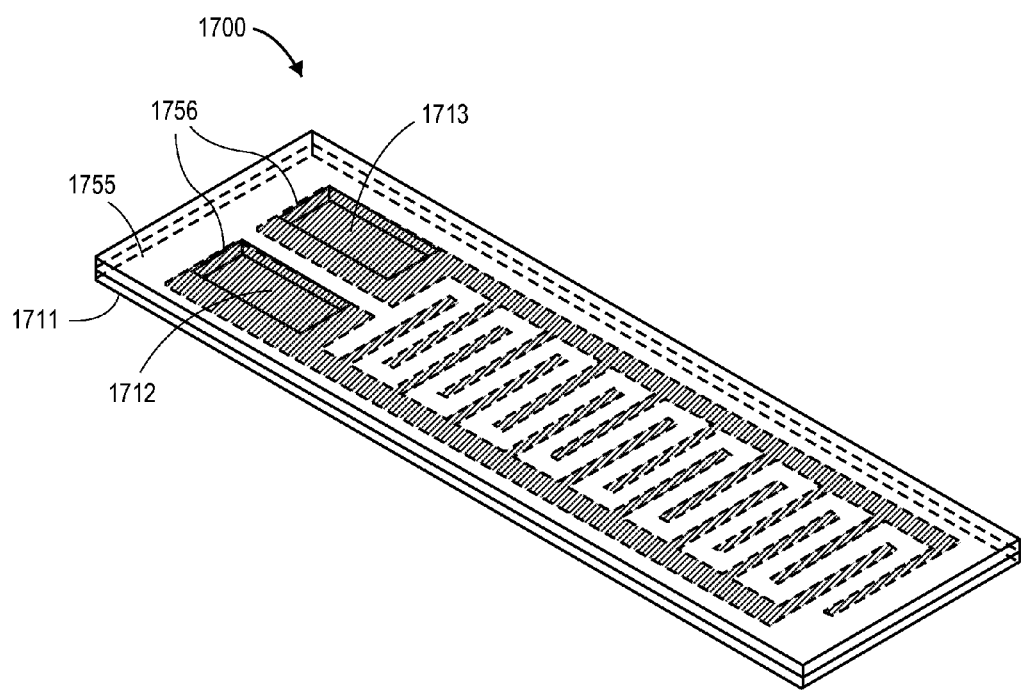
FIG. 17 is an oblique view of an internal comb electrode device in accordance with an embodiment.

FIG. 17 is an oblique view of an internal comb electrode device in accordance with an embodiment. Device 1700 includes bottom piezoelectric parylene C film 1711 and top piezoelectric parylene C film 1755 sandwiching comb electrodes 1712 and 1713. Holes in top piezoelectric parylene C film 1755 allow access points 1756 for the pads of electrodes 1712 and 1713. Enclosing electrodes inside a sandwiched layer can help shield them from corrosion.

In an alternate embodiment, the bottom substrate can be made of insulating material instead of or in addition to parylene C. The insulating material can include polymide, polypropylene, polyethylene, polyester, polycarbonate, nylon, Teflon® polymer, polyvinylidene fluoride, polyvinyl chloride, polyvinyl alcohol, physically deposited inorganic insulating materials, and chemical vapor deposited inorganic insulating materials.

Figure 18:
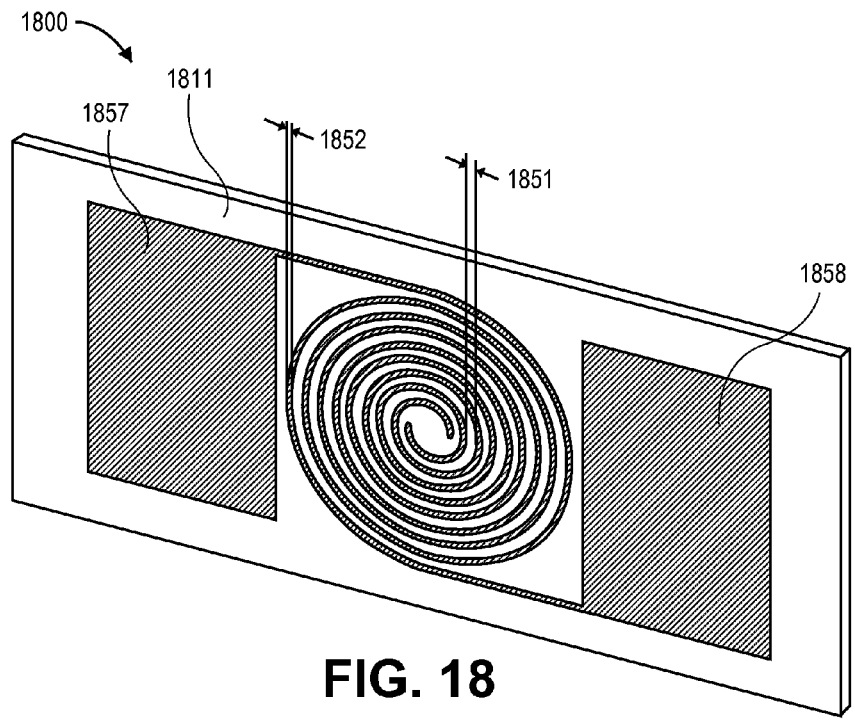
FIG. 18 is an oblique view of an alternate electrode device in accordance with an embodiment.

FIG. 18 is an oblique view of an alternate electrode device in accordance with an embodiment. Device 1800 includes piezoelectric parylene C substrate 1811 with left spiral electrode 1857 and right spiral electrode 1858. The electrodes are intertwined with one another. Distance 1851 between the electrodes is between 0.5 μm to 100 μm. Width 1852 of the electrodes is between 0.5 μm to 100 μm. Other distances and widths are envisioned.

Figure 19:
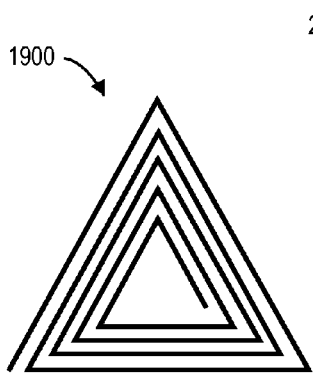
FIGS. 19-21 illustrate alternative electrode shapes in accordance with an embodiment.
Figure 20:
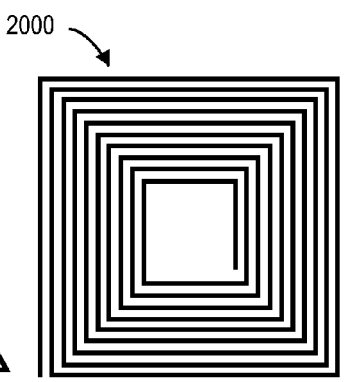
Figure 21:
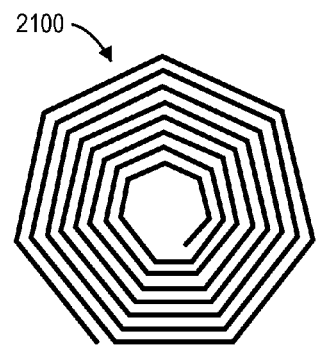

FIGS. 19-21 illustrate alternative electrode shapes in accordance with an embodiment. The shapes or patterns of the electrodes can be three-angle spirangle 1900 of FIG. 19, four-angle spirangle 2000 of FIG. 20, and seven-angle spirangle of FIG. 21.

Figure 22:
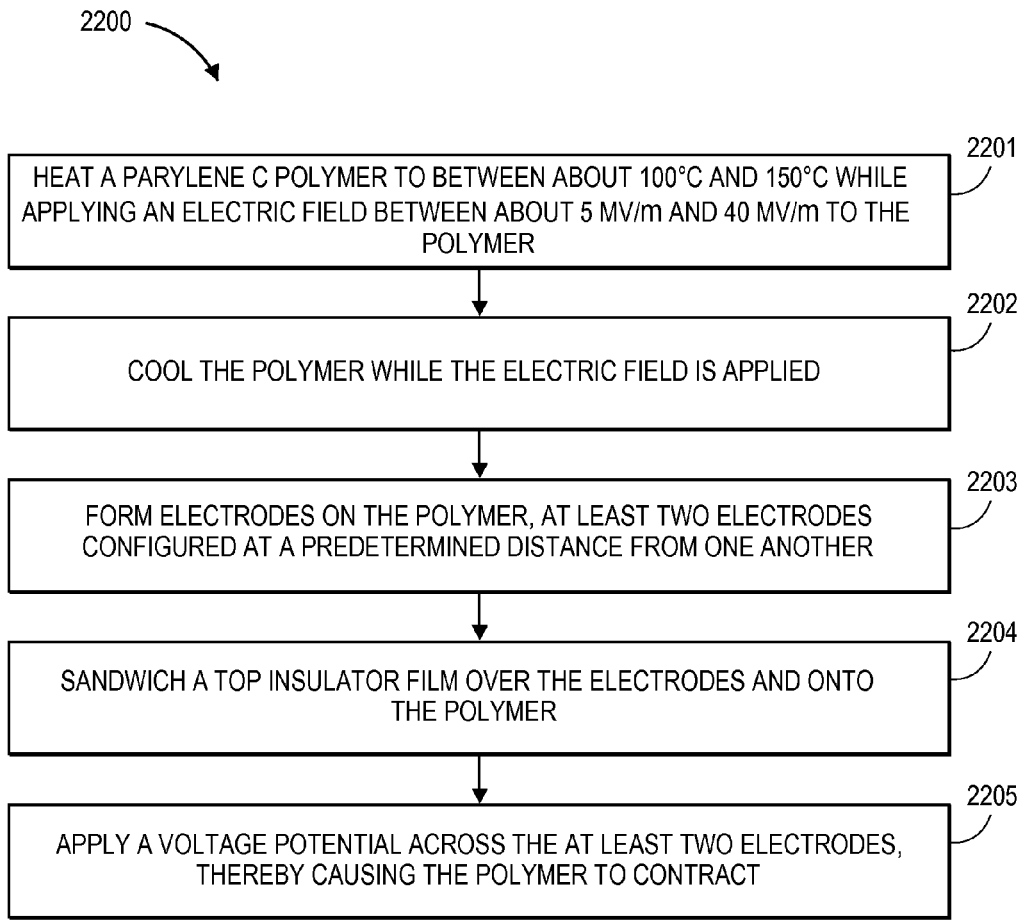
FIG. 22 is a flowchart illustrating a process in accordance with an embodiment.

FIG. 22 is a flowchart illustrating process 2200 in accordance with an embodiment. In operation 2201, a parylene C polymer is heated to between about 100° C. and 150° C. while applying an electric field of about 5 MV/m and 40 MV/m to the polymer. In operation 2202, the polymer is cooled while the electric field is still applied. In operation 2203, electrodes are formed on the polymer. At least two of the electrodes are configured at a predetermined distance from one another. In operation 2204, a top insulator film is sandwiched atop the electrodes and onto the polymer.

The invention has been described with reference to various specific and illustrative embodiments. However, it should be understood that many variations and modifications may be made while remaining within the spirit and scope of the following claims.

What is claimed is:

1. A process of manufacturing comprising:
    heating a parylene-C polymer to a temperature between about 50° C. and 350° C. while applying an electric field to the polymer sufficient to rotate benzene groups about $CH_2$ bonds of polymer chains of the parylene-C polymer and align a majority of chlorine atoms on one side of each polymer chain; and then
    cooling the polymer while the electric field is applied sufficient to freeze the chlorine atoms as aligned; and
    removing the electric field,
    thereby producing piezoelectric parylene-C polymer.
2. The process of claim 1, wherein the heating of the polymer is to a temperature between about 100° C. and 150° C.
3. The process of claim 1, wherein the heating of the polymer is to a temperature between about 250° C. and 350° C. in a low oxygen or vacuum environment.
4. The process of claim 1, wherein the heating of the polymer is performed using a hot plate in contact with the polymer, an oven, an infrared lamp, or blowing hot gas.
5. The process of claim 1, wherein the applying the electric field includes applying an electric field through the polymer between 5 MV/m and 100 MV/m.
6. The process of claim 5, wherein the applying the electric field includes applying an electric field through the polymer to a constant electric field between 5 MV/m and 40 MV/m.
7. The process of claim 1, wherein the cooling includes quenching the polymer.
8. The process of claim 7, wherein the quenching comprises contacting the parylene-C polymer with a room temperature plate or cold plate.
9. The process of claim 1, wherein the polymer is configured as a film less-than-or-equal-to 100 μm thick.
10. The process of claim 9, further comprising:
    attaching an insulating material intimately with a face of the polymer film.
11. The process of claim 1, further comprising:
    forming electrodes on the polymer, at least two electrodes configured at a predetermined distance from one another.
12. The process of claim 11, further comprising:
    measuring an integrated charge between the at least two electrodes, an integration time of the integration being longer than adiabatic temperature transients, thereby measuring mechanical stress.
13. The process of claim 11, further comprising:
    applying a voltage potential between the at least two electrodes, thereby causing the polymer to expand or contract.
14. The process of claim 11, wherein the electrodes are formed as intermeshing comb electrodes.
15. The process of claim 14, wherein:
    a distance between two of the comb electrodes is between 0.5 μm to 100 μm;
    a width of the comb electrodes is between 0.5 μm to 100 μm;
    a length of the comb electrodes is between 1 μm to 2 μm; and
    a thickness of the electrodes is between 100 μm to 2 mm.
16. The process of claim 11, wherein the electrodes are disposed on one face of the polymer.
17. The process of claim 11, wherein the electrodes are disposed on opposing faces of the polymer.
18. The process of claim 11, wherein the electrodes have portions disposed within the polymer.
19. The process of claim 11, wherein the electrodes are each independently a material selected from the group consisting of metal, conducting polymer, conducting inorganic material, and conducting ink.
20. The process of claim 19, wherein each electrode of the electrodes is comprised of a same material as another of the electrodes.
21. A process of manufacturing comprising:
    depositing by chemical vapor deposition parylene-C into a film with a thickness of less-than-or-equal-to 100 μm;
    heating the parylene-C film to a temperature between about 50° C. and 350° C. without stretching the film;
    cooling the parylene-C film to room temperature while an electric field above 5 MV/m is applied to the film, the electric field rotating benzene groups about $CH_2$ bonds of polymer chains of parylene-C in the film and aligning chlorine atoms off the benzene groups on one side of each polymer chain, the cooling performed without stretching the film; and
    removing the electric field.
22. The process of claim 21, wherein the cooling includes contacting the film with a grounded metal plate.

* * * * *